US012585403B2

(12) United States Patent
Ma et al.

(10) Patent No.: US 12,585,403 B2
(45) Date of Patent: Mar. 24, 2026

(54) MEMORY, STORAGE SYSTEM, AND METHOD FOR OPERATING A MEMORY

(71) Applicant: Yangtze Memory Technologies Co., Ltd., Wuhan (CN)

(72) Inventors: Lingling Ma, Wuhan (CN); Lu Guo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/513,215

(22) Filed: Nov. 17, 2023

(65) Prior Publication Data

US 2024/0427519 A1 Dec. 26, 2024

Related U.S. Application Data

(63) Continuation of application No. PCT/CN2023/102217, filed on Jun. 25, 2023.

(51) Int. Cl.
*G06F 3/06* (2006.01)
*G11C 16/10* (2006.01)
*G11C 16/26* (2006.01)

(52) U.S. Cl.
CPC .......... *G06F 3/0655* (2013.01); *G06F 3/0604* (2013.01); *G06F 3/0638* (2013.01);
(Continued)

(58) Field of Classification Search
CPC ...... G05B 13/00–048; G05B 15/00–02; G05B 17/00–02; G06F 1/00–3296;
(Continued)

(56) References Cited

U.S. PATENT DOCUMENTS 8,867,272 B2 * 10/2014 Liu ..................... G06F 11/1012
365/189.011
8,982,617 B1 * 3/2015 Mekhanik .............. G11C 16/20
365/185.02
(Continued)

FOREIGN PATENT DOCUMENTS

CN 111540393 8/2020
CN 114153648 A 3/2022
(Continued)

OTHER PUBLICATIONS

Understanding Memory; Alex Yoon; Feb. 15, 2018; retrieved from https://semiengineering.com/whats-really-happening-inside-memory/ on Nov. 20, 2024 (Year: 2018).*
(Continued)

*Primary Examiner* — Daniel C. Chappell
(74) *Attorney, Agent, or Firm* — Fish & Richardson P.C.

(57) ABSTRACT

This disclosure provides memory, storage system, and operating method for memory. In an implementation, a method comprising: receiving an operation instruction from the controller; mapping a plurality of initial word line identifiers in the operation instruction to a plurality of physical word line identifiers; performing the operation corresponding to the operation instruction on the plurality of first-type memory cell rows through the plurality of first-type word lines indicated by the plurality of physical word line identifiers; wherein, at least one of third-type memory cell rows is distributed between the first memory cell rows and the second memory cell rows in the plurality of first-type memory cell rows, and data stored in the plurality of first-type memory cell rows corresponds to the same parity data.

17 Claims, 9 Drawing Sheets

(52) U.S. Cl.
CPC ............ *G06F 3/0679* (2013.01); *G11C 16/10*
(2013.01); *G11C 16/26* (2013.01)

(58) Field of Classification Search
CPC .............. G06F 3/00; G06F 3/06–0689; G06F
5/00–16; G06F 8/00–78; G06F 9/00–548;
G06F 11/00–3696; G06F 12/00–16; G06F
13/00–4295; G06F 15/00–825; G06F
16/00–986; G06F 18/00–41; G06F
17/00–40; G06F 21/00–88; G06F
2009/3883; G06F 2009/45562–45595;
G06F 2015/761–768; G06F 2201/00–885;
G06F 2206/00–20; G06F 2209/00–549;
G06F 2211/00–902; G06F 2212/00–7211;
G06F 2213/00–4004; G06F 2216/00–17;
G06F 2221/00–2153; G06N 3/00–126;
G06N 5/00–048; G06N 7/00–08; G06N
10/00; G06N 20/00–20; G06N
99/00–007; G06T 1/00–60; G06V
30/00–43; G11B 20/00–24; G11B
33/00–1493; G11C 11/00–5692; G11C
13/00–06; G11C 14/00–009; G11C
15/00–06; G11C 16/00–3495; G11C
17/00–18; G11C 2207/00–229; G11C
2216/00–30; H01L 25/00–50; H01L
2225/00–1094; H03M 7/00–707; H04L
9/00–38; H04L 12/00–66; H04L
41/00–5096; H04L 49/00–9094; H04L
61/00–59; H04L 67/00–75
See application file for complete search history.

(56) References Cited

U.S. PATENT DOCUMENTS

| | | | | |
|---|---|---|---|---|
| 9,330,752 | B2 * | 5/2016 | Yonezawa | G11C 11/5628 |
| 9,367,417 | B2 | 6/2016 | Jung et al. | |
| 9,472,270 | B2 * | 10/2016 | Liang | G11C 11/5628 |
| 10,255,000 | B2 * | 4/2019 | Sharma | G06F 3/0647 |
| 11,733,895 | B2 * | 8/2023 | Lin | G06F 3/0631 |
| | | | | 711/154 |
| 2013/0107628 | A1 * | 5/2013 | Dong | G11C 16/14 |
| | | | | 365/185.17 |
| 2014/0376310 | A1 | 12/2014 | Kim et al. | |
| 2016/0004596 | A1 * | 1/2016 | D'Abreu | G06F 11/108 |
| | | | | 714/773 |
| 2017/0262202 | A1 | 9/2017 | Seo | |
| 2018/0075914 | A1 * | 3/2018 | Sheng | G11C 16/28 |
| 2018/0350446 | A1 * | 12/2018 | K | G11C 29/76 |
| 2019/0096449 | A1 * | 3/2019 | Kim | G11C 7/106 |
| 2019/0278526 | A1 * | 9/2019 | Choi | G06F 3/064 |
| 2020/0210080 | A1 | 7/2020 | Palmer et al. | |
| 2020/0341850 | A1 * | 10/2020 | Choi | G06F 3/0619 |
| 2022/0392536 | A1 | 12/2022 | Wan | |
| 2023/0140746 | A1 | 5/2023 | Jung | |

FOREIGN PATENT DOCUMENTS

| | | |
|---|---|---|
| CN | 114528145 | 5/2022 |
| CN | 115497540 | 12/2022 |
| JP | 2013-101743 A | 5/2013 |
| JP | 2015-506528 A | 3/2015 |
| JP | 2021-522579 A | 8/2021 |
| JP | 2022-515541 A | 2/2022 |
| KR | 20060074179 A | 7/2006 |
| KR | 20220113740 A | 8/2022 |
| TW | 201435884 A | 9/2014 |

OTHER PUBLICATIONS

International Search Report in International Appln. No. PCT/CN2023/
102217, mailed on Feb. 26, 2024, 6 pages (with English translation).
Notice of Allowance in Chinese Appln. No. 202380009665.6,
mailed on Sep. 4, 2025, 5 pages (with machine translation).
Office Action in Japanese Appln. No. 2024-550859, mailed on Oct.
7, 2025, 4 pages (with English translation).
Extended European Search Report in European Appln. No. 23925603.
5, mailed on Sep. 24, 2025, 13 pages.
Office Action in Korean Appln. No. 10-2024-7030307, mailed on
Nov. 25, 2025, 24 pages (with English translation).

* cited by examiner

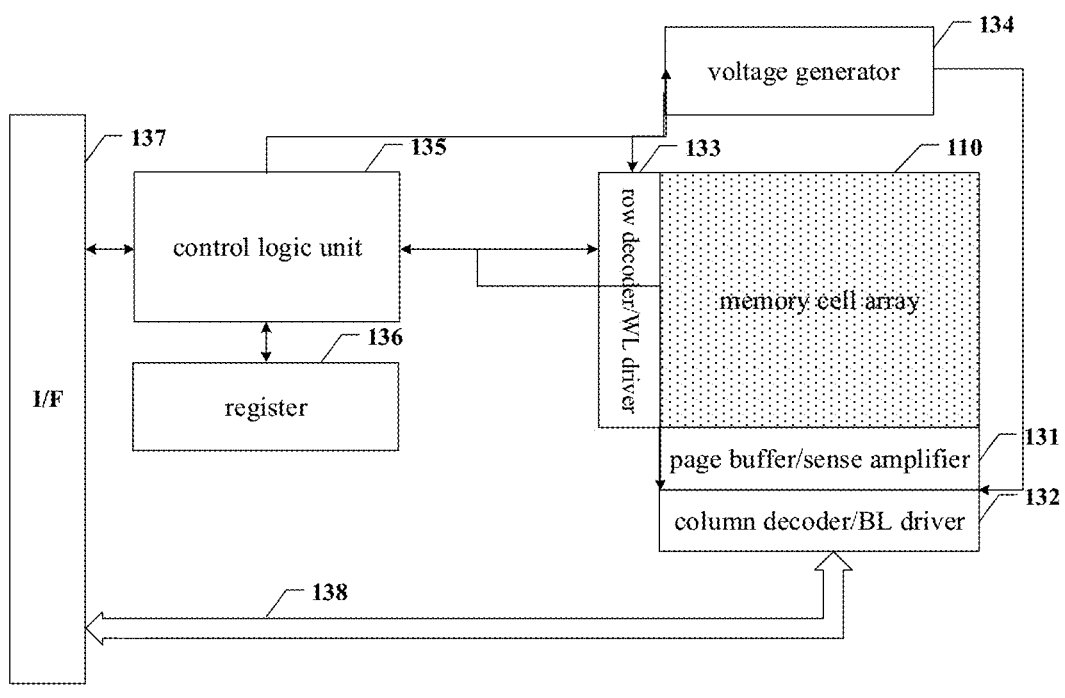

FIG.6

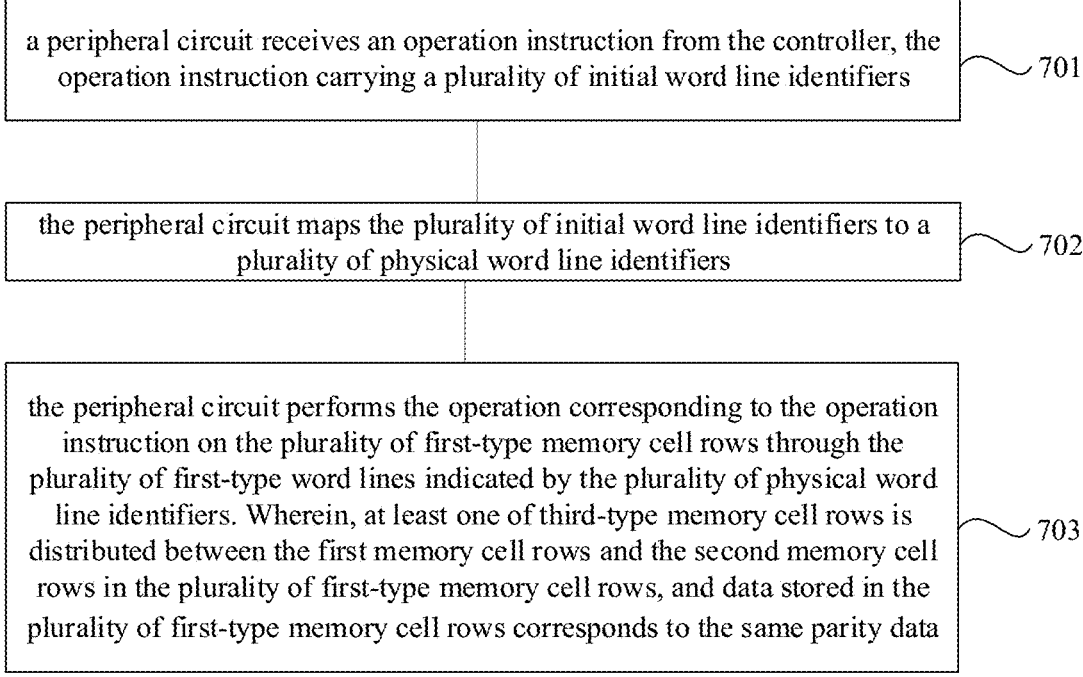

a peripheral circuit receives an operation instruction from the controller, the operation instruction carrying a plurality of initial word line identifiers — 701 the peripheral circuit maps the plurality of initial word line identifiers to a plurality of physical word line identifiers — 702 the peripheral circuit performs the operation corresponding to the operation instruction on the plurality of first-type memory cell rows through the plurality of first-type word lines indicated by the plurality of physical word line identifiers. Wherein, at least one of third-type memory cell rows is distributed between the first memory cell rows and the second memory cell rows in the plurality of first-type memory cell rows, and data stored in the plurality of first-type memory cell rows corresponds to the same parity data — 703

FIG.7

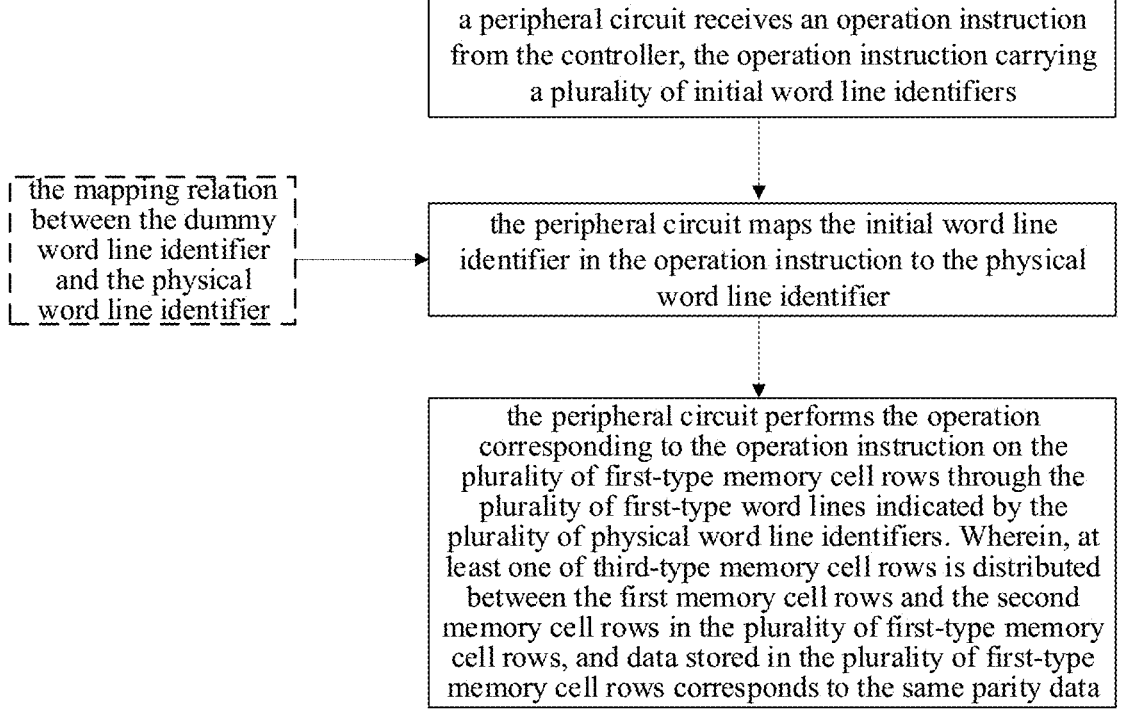

a peripheral circuit receives an operation instruction from the controller, the operation instruction carrying a plurality of initial word line identifiers the mapping relation between the dummy word line identifier and the physical word line identifier the peripheral circuit maps the initial word line identifier in the operation instruction to the physical word line identifier the peripheral circuit performs the operation corresponding to the operation instruction on the plurality of first-type memory cell rows through the plurality of first-type word lines indicated by the plurality of physical word line identifiers. Wherein, at least one of third-type memory cell rows is distributed between the first memory cell rows and the second memory cell rows in the plurality of first-type memory cell rows, and data stored in the plurality of first-type memory cell rows corresponds to the same parity data

FIG.8

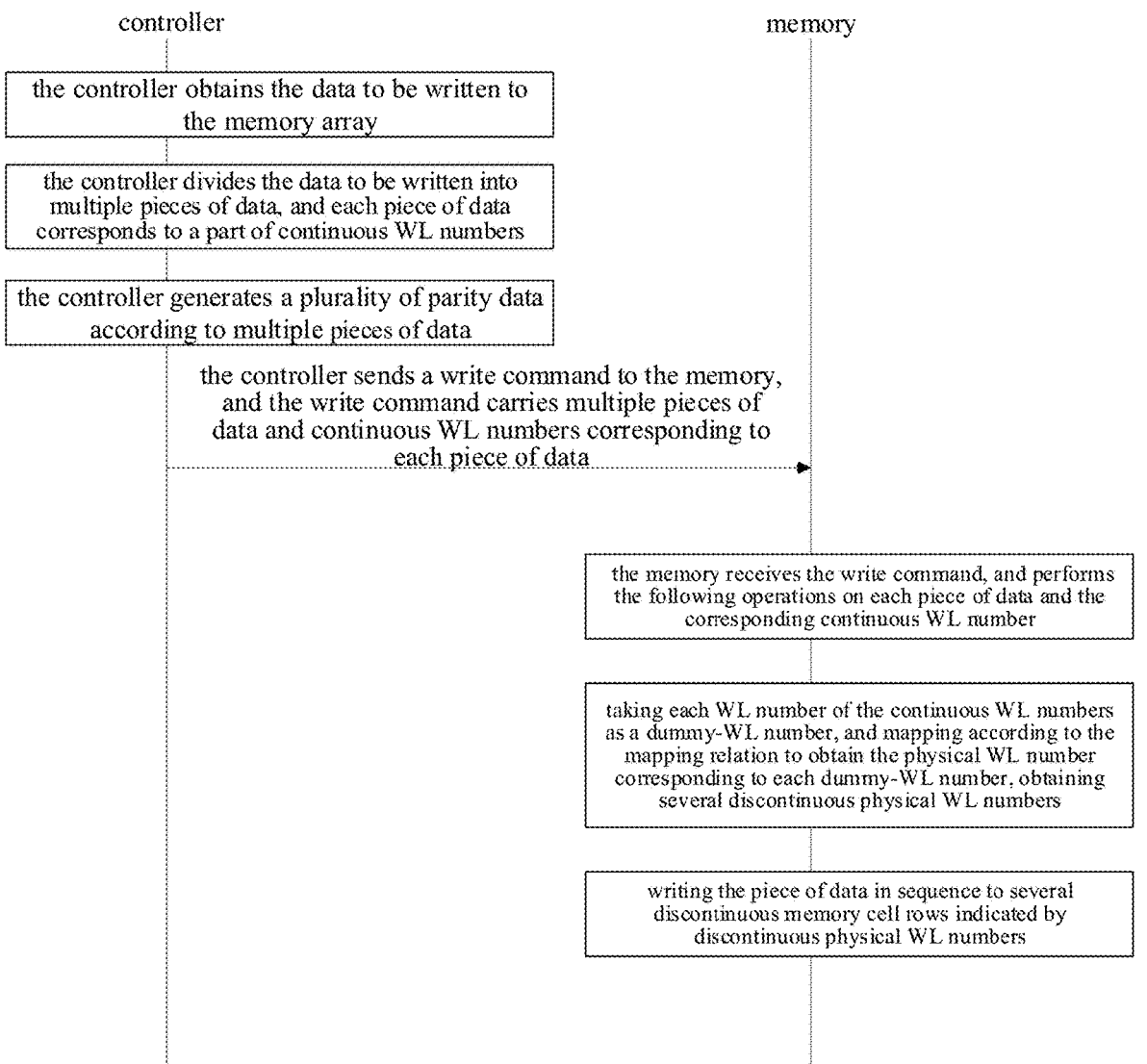

controller                                                                memory the controller obtains the data to be written to
the memory array the controller divides the data to be written into
multiple pieces of data, and each piece of data
corresponds to a part of continuous WL numbers the controller generates a plurality of parity data
according to multiple pieces of data the controller sends a write command to the memory,
and the write command carries multiple pieces of
data and continuous WL numbers corresponding to
each piece of data the memory receives the write command, and performs
the following operations on each piece of data and the
corresponding continuous WL number taking each WL number of the continuous WL numbers
as a dummy-WL number, and mapping according to the
mapping relation to obtain the physical WL number
corresponding to each dummy-WL number, obtaining
several discontinuous physical WL numbers writing the piece of data in sequence to several
discontinuous memory cell rows indicated by
discontinuous physical WL numbers

FIG.9

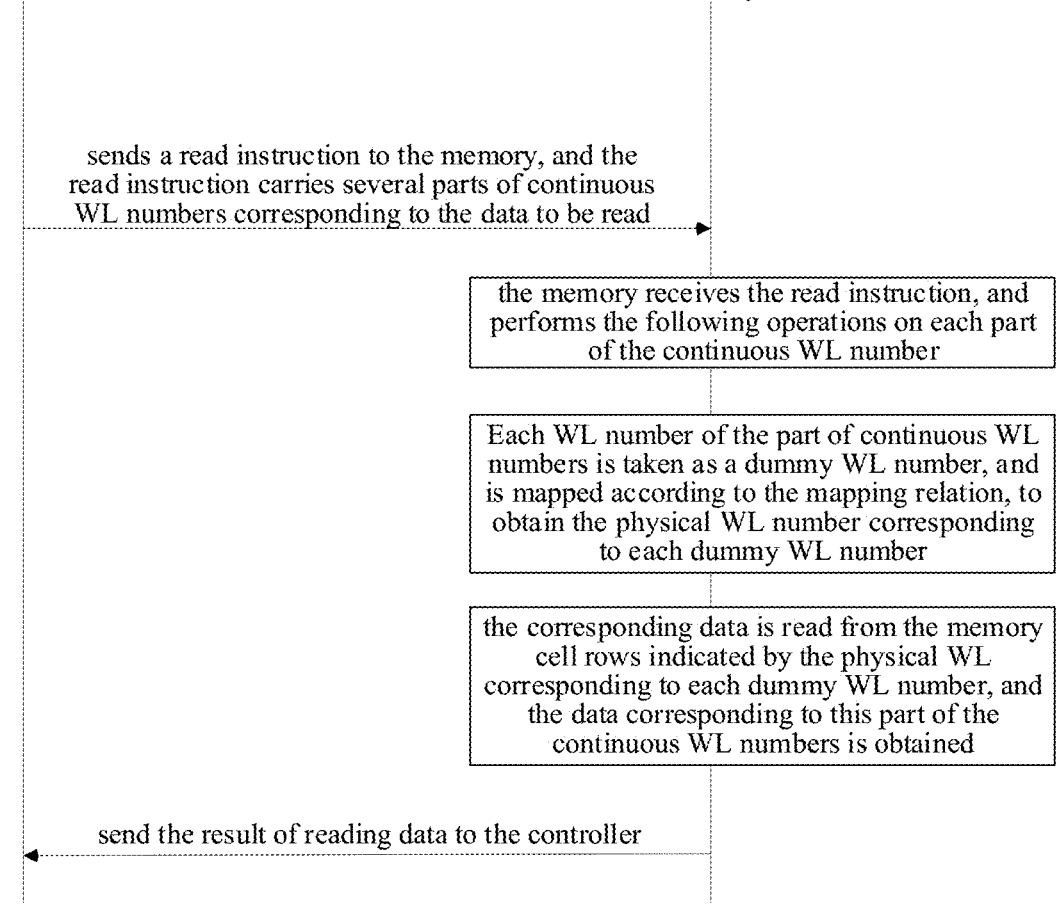

controller                            memory sends a read instruction to the memory, and the read instruction carries several parts of continuous WL numbers corresponding to the data to be read the memory receives the read instruction, and performs the following operations on each part of the continuous WL number Each WL number of the part of continuous WL numbers is taken as a dummy WL number, and is mapped according to the mapping relation, to obtain the physical WL number corresponding to each dummy WL number the corresponding data is read from the memory cell rows indicated by the physical WL corresponding to each dummy WL number, and the data corresponding to this part of the continuous WL numbers is obtained send the result of reading data to the controller

FIG.10

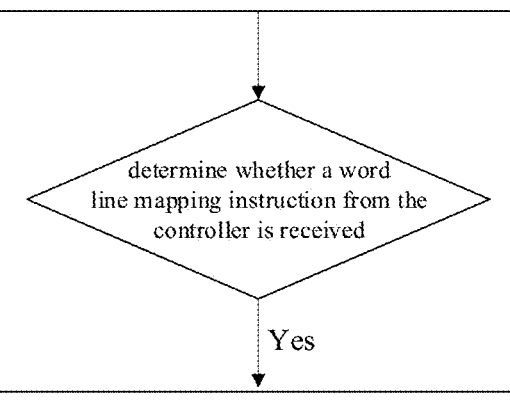

a peripheral circuit receives an operation instruction from the controller, the operation instruction carrying a plurality of initial word line identifiers determine whether a word line mapping instruction from the controller is received Yes the peripheral circuit maps the plurality of initial word line identifiers to a plurality of physical word line identifiers the peripheral circuit performs the operation corresponding to the operation instruction on the plurality of first-type memory cell rows through the plurality of first-type word lines indicated by the plurality of physical word line identifiers. Wherein, at least one of third-type memory cell rows is distributed between the first memory cell rows and the second memory cell rows in the plurality of first-type memory cell rows, and data stored in the plurality of first-type memory cell rows corresponds to the same parity data

FIG.11

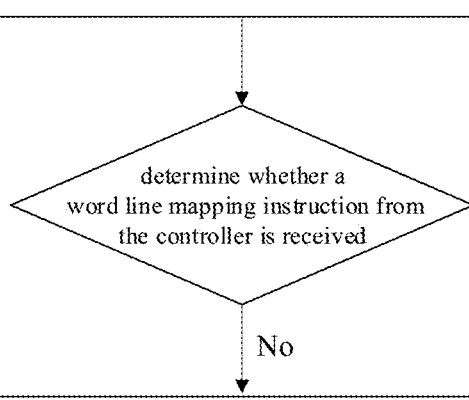

a peripheral circuit receives an operation instruction from the controller, the operation instruction carrying a plurality of initial word line identifiers determine whether a word line mapping instruction from the controller is received No performs the operation corresponding to the operation instruction on the plurality of second-type memory cell rows through the plurality of second-type word lines indicated by the plurality of initial word line identifiers; wherein, the plurality of second-type memory cell rows include a plurality of continuous memory cell rows in the memory array, and data stored in the plurality of second-type memory cell rows corresponds to the same parity data

FIG.12

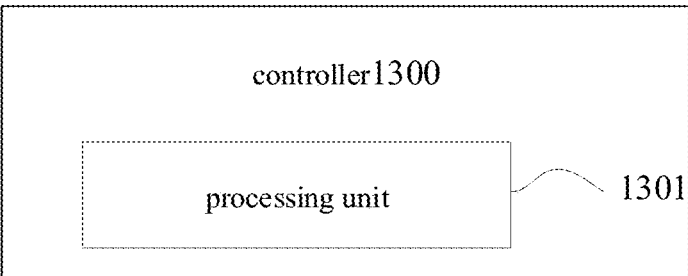

controller 1300 processing unit                    1301

FIG.13

MEMORY, STORAGE SYSTEM, AND METHOD FOR OPERATING A MEMORY

CROSS-REFERENCE TO RELATED APPLICATIONS

This application is a continuation of International Application No. PCT/CN2023/102217, filed on Jun. 25, 2023, the disclosure of which is hereby incorporated by reference in its entirety.

FIELD OF TECHNOLOGY

The present application relates to the technical field of storage, and in particular to a memory, a storage system and a method for operating a memory.

BACKGROUND

When writing data to a memory such as 3D NAND, in order to avoid errors in subsequent reading of data, parity data may be generated according to written data. By this way, when data is read from the memory, the read data is verified according to the parity data, and if the verification fails, correct data may be recovered according to the parity data. Wherein how to ensure the successful recovery of data when the verification fails is a hotspot of current research.

SUMMARY

Examples of the present application provide a memory, a storage system, and a method for operating a memory, which may be configured to improve capabilities for data protection. The technical solution is as follows:
in one aspect, a memory is provided, the memory includes:
a memory array including a plurality of memory cell rows;
a plurality of word lines respectively coupled to the plurality of memory cell rows; and
a peripheral circuit coupled to the plurality of word lines and configured to:
receive an operation instruction from the controller, the operation instruction comprises a plurality of initial word line identifiers;
map the plurality of initial word line identifiers to a plurality of physical word line identifiers;
perform the operation corresponding to the operation instruction on the plurality of first-type memory cell rows through a plurality of first-type word lines indicated by the plurality of physical word line identifiers;
wherein, at least one of third-type memory cell rows is distributed between first memory cell rows and second memory cell rows in the plurality of first-type memory cell rows, and data stored in the plurality of first-type memory cell rows corresponds to the same parity data.
In some examples, the peripheral circuit is configured to:
identify each of the plurality of initial word line identifiers as a dummy word line identifier, and obtain a physical word line identifier corresponding to each of initial word line identifiers from the stored mapping relation between the dummy word line identifier and the physical word line identifier.
In some examples, the mapping relation includes a mapping relation between the first dummy word line identifier and the first physical word line identifier, and a mapping relation between a second dummy word line identifier and a second physical word line identifier;
two memory cell rows coupled to two word lines indicated by the first dummy word line identifier and the second dummy word line identifier are adjacent, and memory cell rows other than the two memory cell rows are distributed between two memory cell rows coupled to two word lines indicated by the first physical word line identifier and the second physical word line identifier.
In some examples, the first dummy word line identifier includes a first dummy word line number, the second dummy word line identifier includes a second dummy word line number, and a difference between the first dummy word line number and the second dummy word line number is one;
the first physical word line identifier includes a first physical word line number, and the second physical word line identifier includes a second physical word line number, and a difference between the first physical word line number and the second physical word line number is greater than one.
In some examples, the first dummy word line number is less than the second dummy word line number;
The second physical word line number is the sum of the first physical word line number and a reference value, and the reference value is a positive integer.
In some examples, at least one of third-type memory cell rows is distributed between every two adjacent memory cell rows of the plurality of first-type memory cell rows.
In some examples, the quantity of third-type memory cell rows distributed between every two adjacent memory cell rows of the plurality of first-type memory cell rows is a reference quantity.
In some examples, the peripheral circuit is configured to:
in response to determining that a word line mapping instruction is received, perform an operation of mapping the plurality of initial word line identifiers to the plurality of physical word line identifiers.
In some examples, the peripheral circuit is further configured to:
in response to determining that the word line mapping instruction from the controller is not received, perform the operation corresponding to the operation instruction on the plurality of second-type memory cell rows through the plurality of second-type word lines indicated by the plurality of initial word line identifiers;
wherein, the plurality of second-type memory cell rows include a plurality of continuous memory cell rows in the memory array, and data stored in the plurality of second-type memory cell rows corresponds to the same parity data.
In some examples, the operation instruction includes a write instruction, and the write instruction also carries multiple pieces of data to be written corresponding one-to-one to the plurality of initial word line identifiers;
the peripheral circuit is configured to:
identify the data to be written corresponding to each of initial word line identifiers as the data to be written corresponding to a respective physical word line identifier, and perform a program operation on the plurality of first-type memory cell rows through the plurality of first-type word lines to store multiple pieces of data to be written to the plurality of first-type memory cell rows.
In some examples, the operation instruction includes a read instruction;

the peripheral circuit is configured to:

perform a read operation on the plurality of first-type memory cell rows through the plurality of first-type word lines to obtain data respectively stored in the plurality of first-type memory cell rows.

In some examples, the peripheral circuit is further configured to:

if data stored in a third memory cell row of the plurality of first-type memory cell rows includes erroneous data, determine the initial word line identifier corresponding to the physical word line identifier of the third memory cell row;

obtain the parity data based on the determined initial word line identifier;

correct data stored in the third memory cell row based on the parity data.

In another aspect, a storage system is provided that includes a memory, and a controller coupled to the memory and configured to control the memory;

the controller is configured to: send the operation instruction to the memory, the operation instruction comprises a plurality of initial word line identifiers;

the memory is configured to: receive the operation instruction, and map the plurality of initial word line identifiers to a plurality of physical word line identifiers; perform the operation corresponding to the operation instruction on the plurality of first-type memory cell rows through the plurality of first-type word lines indicated by the plurality of physical word line identifiers;

wherein, at least one of third-type memory cell rows is distributed between first memory cell rows and second memory cell rows in the plurality of first-type memory cell rows, and data stored in the plurality of first-type memory cell rows corresponds to the same parity data.

In some examples, the controller is further configured to: send a word line mapping instruction to the memory;

the memory is further configured to: in response to the word line mapping instruction, perform an operation of mapping the plurality of initial word line identifiers to the plurality of physical word line identifiers.

In some examples, the controller is further configured to: not sending the word line mapping instruction to the memory;

the memory is further configured to: perform the operation corresponding to the operation instruction on the plurality of second-type memory cell rows through the plurality of second-type word lines indicated by the plurality of initial word line identifiers;

wherein, the plurality of second-type memory cell rows include a plurality of continuous memory cell rows in the memory array, and data stored in the plurality of second-type memory cell rows corresponds to the same parity data.

In some examples, the operation instruction includes a write instruction, and the write instruction also carries multiple pieces of data to be written corresponding one-to-one to the plurality of initial word line identifiers;

the memory is configured to: identify the data to be written corresponding to each of initial word line identifiers as the data to be written corresponding to a respective physical word line identifier, and perform a program operation on the plurality of first-type memory cell rows through the plurality of first-type word lines to store multiple pieces of data to be written to the plurality of first-type memory cell rows.

In some examples, the operation instruction includes a read instruction;

the memory is configured to: perform a read operation on the plurality of first-type memory cell rows through the plurality of first-type word lines to obtain data respectively stored in the plurality of first-type memory cell rows;

the memory is further configured to: send a result of reading data to the controller, wherein the result of reading data carries the data respectively stored in the plurality of first-type memory cell rows;

the controller is configured to: receive the result of reading data.

In another aspect, a method of operating a memory is provided, the method comprising:

receiving an operation instruction from the controller, the operation instruction comprises a plurality of initial word line identifiers;

mapping the plurality of initial word line identifiers to a plurality of physical word line identifiers;

performing the operation corresponding to the operation instruction on a plurality of first-type memory cell rows through the plurality of first-type word lines indicated by the plurality of physical word line identifiers;

wherein, at least one of third-type memory cell rows is distributed between first memory cell rows and second memory cell rows in the plurality of first-type memory cell rows, and data stored in the plurality of first-type memory cell rows corresponds to the same parity data.

In some examples, mapping the plurality of initial word line identifiers to a plurality of physical word line identifiers includes:

taking each of the plurality of initial word line identifiers as a dummy word line identifier, and obtaining a physical word line identifier corresponding to each of initial word line identifiers from the stored mapping relation between the dummy word line identifier and the physical word line identifier.

In some examples, the mapping relation includes a mapping relation between the first dummy word line identifier and the first physical word line identifier, and a mapping relation between a second dummy word line identifier and a second physical word line identifier;

two memory cell rows coupled to two word lines indicated by the first dummy word line identifier and the second dummy word line identifiers are adjacent, and memory cell rows other than the two memory cell rows are distributed between two memory cell rows coupled to two word lines indicated by the first physical word line identifier and the second physical word line identifier.

In some examples, the first dummy word line identifier includes a first dummy word line number, the second dummy word line identifier includes a second dummy word line number, and the difference between the first dummy word line number and the second dummy word line number is one;

the first physical word line identifier includes a first physical word line number, and the second physical word line identifier includes a second physical word line number, and the difference between the first physical word line number and the second physical word line number is greater than one.

In some examples, the first dummy word line number is less than the second dummy word line number;

The second physical word line number is the sum of the first physical word line number and a reference value, and the reference value is a positive integer.

In some examples, at least one of third-type memory cell rows is distributed between every two adjacent memory cell rows of the plurality of first-type memory cell rows.

In some examples, the quantity of third-type memory cell rows distributed between every two adjacent memory cell rows of the plurality of first-type memory cell rows is a reference quantity.

In some examples, mapping the plurality of initial word line identifiers to a plurality of physical word line identifiers includes:

in response to determining that a word line mapping instruction from the controller is received, perform an operation of mapping the plurality of initial word line identifiers to the plurality of physical word line identifiers.

In some examples, the method further comprises:

in response to determining that the word line mapping instruction from the controller is not received, perform the operation corresponding to the operation instruction on the plurality of second-type memory cell rows through the plurality of second-type word lines indicated by the plurality of initial word line identifiers;

wherein, the plurality of second-type memory cell rows include a plurality of continuous memory cell rows in the memory array, and data stored in the plurality of second-type memory cell rows corresponds to the same parity data.

In some examples, the operation instruction includes a write instruction, and the write instruction also carries multiple pieces of data to be written corresponding one-to-one to the plurality of initial word line identifiers;

performing the operation corresponding to the operation instruction on the plurality of first-type memory cell rows through the plurality of first-type word lines indicated by the plurality of physical word line identifiers including:

taking the data to be written corresponding to each of initial word line identifiers as the data to be written corresponding to a respective physical word line identifier, and perform a program operation on the plurality of first-type memory cell rows through the plurality of first-type word lines to store multiple pieces of data to be written to the plurality of first-type memory cell rows.

In some examples, the operation instruction includes a read instruction;

performing the operation corresponding to the operation instruction on the plurality of first-type memory cell rows through the plurality of first-type word lines indicated by the plurality of physical word line identifiers including:

performing a read operation on the plurality of first-type memory cell rows through the plurality of first-type word lines to obtain data respectively stored in the plurality of first-type memory cell rows.

In some examples, the method further comprises:

if the data stored in a third memory cell row of the plurality of first-type memory cell rows is erroneous data, determining the initial word line identifier corresponding to the physical word line identifier of the third memory cell row;

obtaining the parity data based on the determined initial word line identifier;

correcting data stored in the third memory cell row based on the parity data.

In an example of this application, since at least one of third-type memory cell rows is distributed between the first memory cell rows and the second memory cell rows in the plurality of first-type memory cell rows, and data stored in the plurality of first-type memory cell rows corresponds to the same parity data, thus through the method provided by the example of the present application, multiple pieces of data corresponds to the same parity data may be written to discontinuous memory cell rows. By this way, it may be implemented that the data stored in adjacent memory cell rows in the memory array corresponds to different parity data. By this way, even if the distance between adjacent memory cell rows is too small and thus the charges will interact with each other, which further causes the data stored in adjacent memory cell rows to be in error at the same time, however since the data stored in adjacent memory cell rows corresponds to different parity data, the data stored in adjacent memory cell rows may be respectively corrected through at least two pieces of parity data, thereby the capability of protecting data is improved.

BRIEF DESCRIPTION OF THE DRAWINGS

In order to more clearly illustrate the technical solutions in the examples of the present application, the accompanying drawings that require to be used in the description of the examples will be briefly introduced below, and apparently, the accompanying drawings in the following description are only some examples of the application, and for those skilled in the art, other drawings may also be obtained according to these accompanying drawings without any creative effort.

FIG. 6 is a schematic diagram of a peripheral circuit provided by an example of the present application;

FIG. 7 is a flowchart of a method of operating a memory provided by an example of the present application;

FIG. 8 is a flowchart of another method of operating a memory provided by an example of the present application;

FIG. 9 is a flowchart of writing data provided by an example of the present application;

FIG. 10 is a flowchart of reading data provided by an example of the present application;

FIG. 11 is a flowchart of another method of operating a memory provided by an example of the present application;

FIG. 12 is a flowchart of another method of operating a memory provided by an example of the present application;

FIG. 13 is a structure schematic diagram of a controller provided by an example of the present application.

DETAILED DESCRIPTION

In order to make the purpose, technical solution and advantages of the present application clearer, implementations of the present application will be further described in detail below in conjunction with the accompanying drawings.

Figure 1:
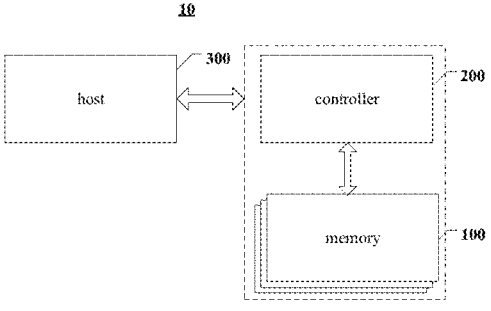
FIG. 1 is a schematic diagram of a storage system 10 provided by an example of the present application.

FIG. 1 is a schematic diagram of a storage system 10 provided by an example of the present application. As shown in FIG. 1, the storage system 10 includes: one or more memories 100, and a controller 200 coupled to the memories 100 and configured to control the memories 100.

The controller 200 may be configured to control operations performed by the memory 100. For example, operations of reading, erasing, and programming. The controller 200 may be further configured to manage various functions related to data stored or to be stored in memory 100, including but not limited to bad block management, garbage collection, logical-to-physical address translation, wear leveling, etc. In some examples, the controller 200 may be further configured to process error correction code (ECC) related to data read from or written to memory 100. The controller 200 may also perform any other suitable functions. For example, formatting the memory 100.

The controller 200 may communicate with external devices according to a particular communication protocol. In some examples, the controller 200 may communicate with external devices through at least one of various interface protocols. The interface protocol may be Universal Serial Bus (USB) protocol, Multi-Media card (MMC) protocol, Peripheral Component Interconnect (PCI) protocol, PCI Express (PCI-E) protocol, Advanced Technology Attachment (ATA) protocol, Serial ATA protocol, Parallel ATA protocol, Small Computer System Interface (SCSI) protocol, Enhanced Small Disk Interface (ESDI) protocol, Integrated Development Environment (IDE) protocol, Fire wire protocol, etc.

In some examples, the controller 200 and one or more memories 100 may be integrated to various types of electronic devices. The electronic device 100 may be a mobile phone, a desktop computer, a laptop computer, a tablet, a vehicle computer, a gaming console, a printer, a positioning device, a wearable electronic device, a smart sensor, a Virtual Reality (VR) device, an Augmented Reality (AR) device, or any other suitable electronic devices having memory device therein. In this scenario, as shown in FIG. 1, the storage system 10 further includes a host 300. The controller 200 is coupled to a host 300. The controller 200 may manage data stored in the memory 100 and communicate with the host 300 to implement functions of the aforementioned electronic devices.

In other examples, the controller 200 and one or more memories 100 may be integrated to various types of memory devices.

Figure 2:
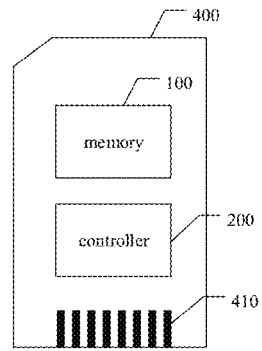
FIG. 2 is a schematic diagram of a memory device provided by an example of the present application.

As an example, as shown in FIG. 2, the controller 200 and a single memory 100 may be integrated to a memory card 400. The memory card 400 may include Personal Computer Memory Card International Association (PCMCIA, PC) card, Compact Flash (CF) card, Smart Media (SM) card, memory stick, Multi-Media Card (MMC), Reduced size MMC (RS-MMC), micro-MMC, Secure Digital (SD) card, Universal Flash Storage (UFS), etc. As shown in FIG. 2, the memory card 400 may further include a connector 410 for coupling the memory card 400 with a host.

Figure 3:
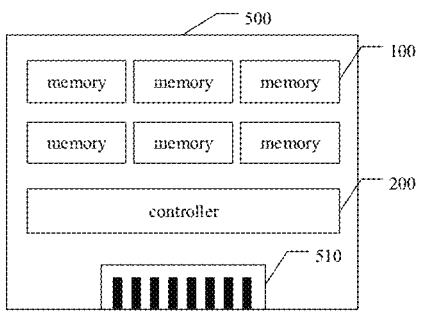
FIG. 3 is schematic diagram of another memory device provided by an example of the present application.

As another example, as shown in FIG. 3, the controller 200 and a plurality of memories 100 may be integrated to a Solid State Disk (SSD) 500. The solid state drive 500 may also include a connector 510 that couples the solid state drive 500 with a host. Wherein at least one of the storage capacity or operating speed of the solid state drive 500 is greater than at least one of the storage capacity or operating speed of the memory card 400.

Additionally, the memory 100 in FIG. 1 to FIG. 3 may be any memory involved in examples of the present application. For example, it could be a 3D NAND (NAND gate) memory. The structure of the memory 100 is explained and described below.

Figure 4:
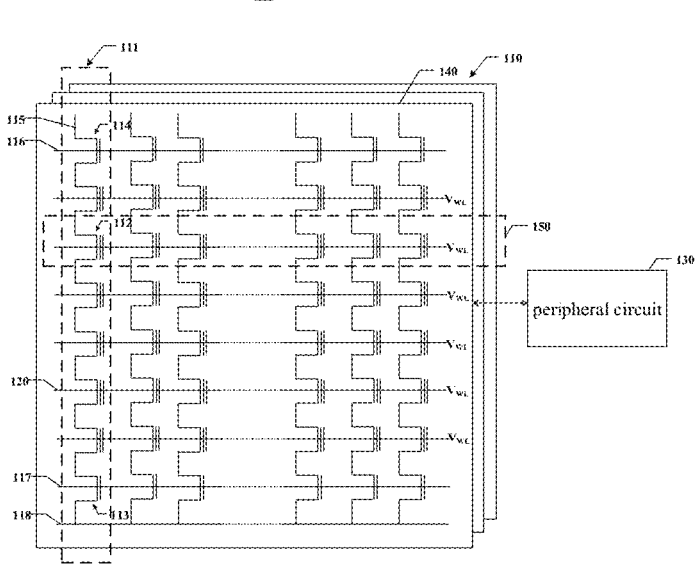
FIG. 4 is a schematic diagram of a memory 100 provided by an example of the present application.

FIG. 4 is a schematic diagram of a memory 100 provided by an example of the present application. As shown in FIG. 4, the memory 100 includes:

a memory array 110 including a plurality of memory cell rows;

a plurality of word lines 120 respectively coupled to a plurality of memory cell rows;

a peripheral circuit 130 coupled to the plurality of word lines 120 and configured to perform an operation such as programming (i.e., writing data) or reading data on a selected memory cell rows of the plurality of memory cell rows, the selected memory cell rows is a memory cell row that the selected line is coupled to, wherein, in order to perform operations such as programming or reading data, the peripheral circuit 130 is configured to perform the method of operating a memory provided by an example of the present application.

The memory array 110 may be a NAND flash memory array. As shown in FIG. 1, the NAND flash memory array includes a plurality of memory strings 111 arranged in an array on a substrate, and each of memory strings 111 extends vertically above the substrate (not shown). In some examples, each of memory strings 111 includes a plurality of memory cells 112 coupled in series and stacked vertically.

As shown in FIG. 4, each of memory strings 111 may further include a source select gate (SSG) 113 at the bottom and a drain select gate (DSG) 114 at the top. A source select gate is also referred to as a lower select transistor, a bottom select gate (BSG) or a source select transistor, and a drain select gate is also referred to as a upper select transistor, a top select gate (TSG) or a drain select transistor. The source select gate 113 and the drain select gate 114 may be configured to activate a selected string 111 during a read operation and a program operation.

In some examples, the drain select gate 114 of each of memory strings 111 is coupled to a corresponding bit line 115 from which data may be read or written via an output bus (not shown).

In some examples, each of memory strings 111 is configured to apply a select voltage (e.g., higher than the threshold voltage of a transistor having a drain select gate 114) or a deselect voltage (e.g., 0 V) to the corresponding drain select gate 114 through one or more DSG lines 116. Alternatively, in some examples, each of memory strings 111 is configured to be selected or deselected through applying a select voltage (e.g., higher than the threshold voltage of a transistor having a source select gate 113) or a deselect voltage (e.g., 0 V) to the corresponding source select gate 113 via one or more SSG lines 117.

As shown in FIG. 4, the memory string 111 may be organized to a plurality of blocks 140, and for any block 140 of the plurality of blocks 140, the block 140 may have a source line (SL) 118, and sources of all memory strings 111 in the block 140 are coupled through the source line 118, which is also referred to as a common source line or an array common source (ACS).

Wherein, the source line 118 may be used for grounding, so as to implement grounding of the source of each of memory cells of the memory string in the block 140 later in some operations. In some examples, in some other operations, the source of each of memory cells of the memory string in the block 140 may also be connected to a high voltage through the source line 118.

Wherein, each of blocks 140 is a basic data unit for an erase operation, that is, all memory cells 112 on the same block 140 are erased at the same time. To erase memory cells 112 in a selected block, the source line coupled to the selected block may be biased with an erase voltage (Vers), e.g., a high positive voltage (20V or higher).

It should be understood that, in other examples, erase operations may be performed at the half-block level, at the quarter-block level, or at a level with any suitable number of blocks or any suitable fraction of blocks.

As shown in FIG. 4, the memory cells 112 of the same layer with adjacent memory strings 111 in the same block 140 may be coupled through the word line 120, and the word line 120 is configured to select which layer of the memory cells 112 in block 140 is affected by a read operation and a program operation.

In some examples, each of word lines 120 is coupled to the page 150 to which the memory cell 112 belongs, the page 150 is the basic data unit for a program operation. Wherein, the size of the page 150 may be related to the number of memory strings 111 coupled to the word line 120 in one block 140. Each of word lines 120 may be coupled to the control gate (i.e., gate electrode) of each of memory cells 112 in a corresponding page 150. It may be understood that a memory cell row is a plurality of memory cells 112 located on the same page 150.

It should be noted that memory cells in the same layer in one block 140 corresponds to the same word line, but memory cells in the same layer may be divided to one or more pages. That is, one word line may be coupled to one or more pages, e.g., for SLC, one word line is coupled to one page, and for MLC, one word line is coupled to two pages.

Figure 5:
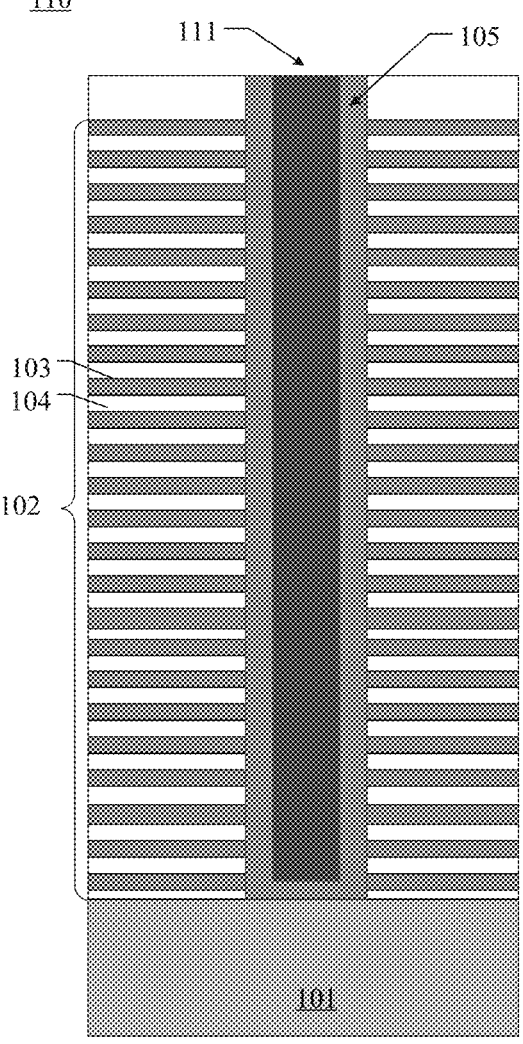
FIG. 5 is a schematic diagram of cross section of a memory array 110 including memory strings 111 provided by an example of the present application.

FIG. 5 is a schematic diagram of cross section of a memory array 110 including memory strings 111 provided by an example of the present application. As shown in FIG. 5, the memory string 111 may extend vertically above the substrate 101 and through the stacked layers 102. The substrate 101 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

The stacked layer 102 may include alternating gate conductive layers 103 and gate-to-gate dielectric layers 104. The number of pairs of gate conductive layers 103 and gate-to-gate dielectric layers 104 in the stacked layer 102 may determine the number of memory cells 112 in memory array 110.

The gate conductive layer 103 may include conductive materials including but not limited to tungsten (W), cobalt (Co), copper (Cu), aluminum (Al), polysilicon, doped silicon, silicide or any combination thereof. In some examples, each of gate conductive layers 103 includes a metal layer, e.g., a tungsten layer. In other examples, each of gate conductive layers 103 includes a doped polysilicon layer. Additionally, each of gate conductive layers 103 may include a control gate surrounding the memory cell 112 and may extend laterally at the top of the stacked layer 102 as a DSG line 116, extend laterally at the bottom of the stacked layer 102 as a SSG line 117, or extend laterally between the DSG line 116 and the SSG line 117 as a word line 120.

As shown in FIG. 5, a memory string 111 includes a channel structure 102 extending vertically through stacked layer 102. In some examples, a channel structure 105 includes a channel hole filled with semiconductor material (s) (e.g., as a semiconductor channel) and dielectric material (s) (e.g., as a memory film). A semiconductor channel includes silicon, e.g., polysilicon. A memory film is a composite dielectric layer including a tunneling layer, a storage layer (also referred to as a "charge trapping/storage layer"), and a blocking layer.

In some examples, channel structure 105 has a cylindrical shape (e.g., a pillar shape). A semiconductor channel and layers in a storage film are radially arranged in this order from the center of the pillar toward the outer surface of the pillar.

It should be understood that although not shown in FIG. 5, the memory array 110 may also include other additional components, including but not limited to gate line gaps/ source contacts, local contacts, interconnection layers, etc.

Referring back to FIG. 4, a peripheral circuitry 130 may be coupled to memory array 110 through bit line 115, word line 120, source line 118, SSG line 117, and DSG line 116. The peripheral circuitry 130 may include any suitable analog, digital, and mixed-signal circuitry for facilitating operation of the memory array 110 through at least one of applying a voltage signal or a current signal to and at least one of sensing voltage signal or current signal from memory cell 112 via bit line 115, word line 120, source line 118, SSG line 117, and DSG line 116.

The peripheral circuit 130 may include various types of peripheral circuits formed with metal-oxide-semiconductor (MOS) technology. For example, FIG. 6 illustrates some examples of peripheral circuits 130, the peripheral circuit 130 includes page buffer/sense amplifier 131, column decoder/bit line (BL) driver 132, row decoder/word line (WL) driver 133, voltage generator 134, control logic unit 135, register 136, interface 137 and data bus 138. It should be understood that in some examples, additional peripheral circuits not shown in FIG. 6 may also be included.

The page buffer/sense amplifier 131 may be configured to read data from and program (write) data to the memory array 110 according to control signals from the control logic unit 135. For example, the page buffer/sense amplifier 131 may store a page of programming data (written data) to be programmed to one page 130 of the memory array 110. The page buffer/sense amplifier 131 may perform a verify operation to ensure that data has been correctly programmed to memory cell 112 coupled to selected word line 120. The page buffer/sense amplifier 131 may also sense a low power signal from bit line 115, the low power signal represents a data bit stored in memory cell 112 and amplify a small voltage swing to a recognizable logic level during a read operation.

The column decoder/bit line driver 132 may be configured to be controlled by control logic unit 135 and to select one or more memory strings 111 through applying a bit line voltage generated from voltage generator 134.

The row decoder/word line driver 133 may be configured to be controlled by control logic unit 135 and select/deselect block 140 of memory array 110 and select/deselect word line 120 of block 140. The row decoder/word line driver 133 may also be configured to drive word line 120 with a word line voltage (VWL) generated from voltage generator 134. In some examples, the row decoder/word line driver 133 may also select/deselect and drive the SSG line 117 and the DSG line 116. As described in detail below, the row decoder/word line driver 133 is configured to perform erase operations on the memory cells 112 coupled to the selected word line (s) 120.

The voltage generator 134 may be configured to be controlled by the control logic unit 135, and generate word line voltage (e.g., read voltage, programming voltage, pass voltage, local voltage, verify voltage, etc.), bit line voltage and source line voltage to be supplied to the memory array 110.

Control logic unit 135 may be coupled to each of the peripheral circuits described above and configured to control operations of each of the peripheral circuits.

Register 136 may be coupled to the control logic unit 135 and a register may include status register, command register and address register for storing status information, command operation code (OP code) and command address for controlling operations of each of the peripheral circuits.

Interface (I/F) 137 may be coupled to control logic unit 135 and act as a control buffer to buffer and relay control commands received from a host (not shown) to control logic unit 135 and to buffer and relay status information received from the control logic unit 135 to the host. The interface 137 may also be coupled to column decoder/bit line driver 132 via data bus 138 and act as a data I/O interface and data buffer to buffer and relay data to/from memory array 110.

The above descriptions of the memory-related hardware examples have beneficial effects similar to those of the following method examples. For technical details not disclosed in the memory-related hardware examples, please refer to the description of the method examples of the present application for understanding.

Based on the memory shown in FIGS. 1 to 6, the controller 200 may write data to or read data from the memory cells in the memory array 110 through the peripheral circuit 130 in the memory 100. After writing data to the memory cell, the charge stored in the memory cell reaches a certain state, however the charge stored in the memory cell may subsequently change due to the influence of the surrounding environment, therefore an error in reading data may occur after data is read from the memory cell. Based on this, after data is written to the memory array, parity data is also generated and stored for the written data. If there is an error in reading data subsequently, the read data may be corrected according to the stored parity data, so as to recover the correct data.

There may be a plurality of ways to generate the parity data. In some examples, the way of generating the parity data includes 1WL_RAID (redundant array of independent disks), 2WL_RAID, . . . , nWL_RAID, etc. Wherein, 1WL_RAID may be understood as generating a piece of parity data for data stored in a plurality of continuous memory cell rows. nWL_RAID may be understood as generating n pieces of parity data for data stored in a plurality of continuous memory cell rows, where n is a positive integer greater than 1.

A larger n indicates an amount of parity data generated for the data stored in a plurality of continuous memory cell rows is larger, thus even if the data stored in two or more memory cell rows of a plurality of continuous memory cell rows has errors, correct data may be recovered based on the plurality of pieces of parity data. Therefore, a greater n indicates a greater protection capability of the nWL_RAID approach.

Wherein, the parity data may be stored in SRAM (static random-access memory). In this scenario, a large n may easily cause the cost of the SRAM to increase. In some examples, the parity data may also be stored in the memory array. In this scenario, a large n may easily cause cumbersome operations when writing data to the memory, and may further reduce the write performance of the memory. Based on this, in many scenarios, the parity data may be generated through 1WL_RAID approach to avoid problems caused by nWL_RAID.

At present, the increasing number of WL layers in 3D NAND causes the continuous reduction of the width between adjacent WLs. In this case, the charges stored in adjacent memory cell rows coupled to adjacent WLs are likely to affect each other, thereby causing a greater probability of occurring errors in data stored in adjacent memory cell rows coupled to adjacent WLs at the same time. However, in the 1WL_RAID approach, since the data stored in a plurality of continuous memory cell rows has only one copy of parity data, only data stored in one row of the a plurality of continuous memory cell rows is allowed to have error, and if data stored in all of more than two (including two) rows of the a plurality of continuous memory cell rows have error, correct data may not be recovered based on the parity data.

Based on this, the present application provides a method of operating a memory. Through the method provided by the example of the present application, parity data may be generated in the 1WL_RAID mode and meanwhile data stored in adjacent memory cell rows are allowed to have error, thereby indirectly implementing the protection capability of the nWL_RAID approach.

The method of operating a memory provided by an example of the present application is explained and described below.

FIG. 7 is a flowchart of a method of operating a memory provided by an example of the present application. In some examples, the method is applied to the peripheral circuit of the memory shown in FIGS. 1-6, and to a control logic unit in the peripheral circuit, and the subsequent examples are explained and described with the peripheral circuit as the main body of performing. As shown in FIG. 7, the method includes the following Operations.

Operation 701: a peripheral circuit receives an operation instruction from the controller, the operation instruction comprises a plurality of initial word line identifiers.

In some examples, the controller may write data to the memory array through an operation instruction. In this scenario, the controller sends an operation instruction including a write instruction to the memory, and the peripheral circuit of the memory receive the operation instruction. Wherein, the write instruction also carries multiple pieces of data to be written corresponding one-to-one to a plurality of initial word line identifiers. The peripheral circuit may subsequently write the data to be written to memory cell rows corresponding to a plurality of initial word line identifiers through operations 702 and 703.

Wherein, when the controller sends the write instruction to the memory, one piece of parity data corresponding to multiple pieces of data to be written also be generated. For example, the write instruction may also carry the parity data, so as to also store the parity data to the memory array. In some examples, the controller may also store the parity data in other memory devices, e.g., SRAM. Examples of the present application do not limit the way in which the controller stores the parity data.

In some other examples, the controller may read data from the memory array through an operation instruction. In this scenario, the controller sends an operation instruction including a read instruction to the memory, and the peripheral circuit of the memory receive the operation instruction. The peripheral circuit may subsequently read the data from memory cell rows corresponding to a plurality of initial word line identifiers through operations 702 and 703.

Wherein, the initial word line identifier is configured to uniquely indicate a word line. In some examples, the initial word line identifier may include an initial word line number. For example, a plurality of initial word line identifiers may be WL1-WL5. In some examples, the initial word line identifiers may also include other symbols capable of taking word lines, e.g., a plurality of initial word line identifiers may include Wla-WLe.

Operation 702: the peripheral circuit maps the plurality of initial word line identifiers to a plurality of physical word line identifiers.

In an example of the present application, in order to avoid writing multiple pieces of data to be written corresponding to the same parity data to a plurality of continuous memory cell rows, when the peripheral circuit receives a write instruction sent by the controller, the plurality of initial word line identifiers in the write instruction may also be mapped to a plurality of physical word line identifiers, so that the memory cell rows indicated by the plurality of physical word line identifiers after mapping are discontinuous.

That is, in an example of the present application, the peripheral circuit does not directly write data according to the word line indicated by the initial word line identifier in the write instruction, but maps the initial word line identifier in the write instruction according to certain rules, in order to facilitate subsequent writing data according to the word line indicated by the physical word line identifier after mapping.

Accordingly, when the peripheral circuit receives a read instruction from the controller, it also requires to map the initial word line identifier carried in the read instruction to a physical word line identifier, so as to read correct data.

In some examples, the implementation of the peripheral circuit mapping a plurality of initial word line identifiers to a plurality of physical word line identifiers may be: taking each of the plurality of initial word line identifiers as a dummy word line identifier, and obtaining a physical word line identifier corresponding to each of initial word line identifiers from the stored mapping relation between the dummy word line identifier and the physical word line identifier.

FIG. 8 is a flowchart of another method of operating a memory provided by an example of the present application. As shown in FIG. 8, when the peripheral circuit receives an operation instruction from the controller, the peripheral circuit firstly maps the initial word line identifier in the operation instruction to the physical word line identifier according to the mapping relation between the dummy word line identifier and the physical word line identifier, then, executes the operation instruction based on the physical word line identifier after mapping.

In order to improve the efficiency of writing data or reading data, the mapping relation between the dummy word line identifier and the physical word line identifier may be configured in advance in the peripheral circuit. By this way, when the peripheral circuit is to write data, the initial word line identifier may be mapped based on the mapping relation.

In some examples, the mapping relation described above may not be configured in the peripheral circuit. In this scenario, when the peripheral circuit is to write data or read data, the initial word line identifier may be temporarily mapped according to a certain algorithm. Subsequent examples are illustrated by taking mapping through a mapping relation as an example.

For ease of understanding, the mapping relation is explained and described below.

In some examples, the mapping relation includes a mapping relation between the first dummy word line identifier and the first physical word line identifier, and a mapping relation between a second dummy word line identifier and a second physical word line identifier. Wherein two memory cell rows coupled to two word lines indicated by the first dummy word line identifier and the second dummy word line identifier are adjacent, and memory cell rows other than the two memory cell rows are distributed between two memory cell rows coupled to two word lines indicated by the first physical word line identifier and the second physical word line identifier.

Wherein the mapping relation may include a plurality of dummy word line identifiers and physical word line identifiers respectively corresponding to the plurality of dummy word line identifiers. The first dummy word line identifier and the second dummy word line identifier may be two of the plurality of dummy word line identifiers.

Since two memory cell rows coupled to two word lines indicated by the first dummy word line identifier and the second dummy word line identifier are adjacent, and memory cell rows other than the two memory cell rows are distributed between two memory cell rows coupled to two word lines indicated by the first physical word line identifier and the second physical word line identifier, therefore, through this mapping relation, it may be implemented that: in the case that the memory cell rows indicated by the plurality of initial word line identifiers are continuous, the memory cell rows indicated by the plurality of physical word line identifiers after mapping are discontinuous.

In some examples, the first dummy word line identifier includes a first dummy word line number, the second dummy word line identifier includes a second dummy word line number, and the difference between the first dummy word line number and the second dummy word line number is one; that is, two memory cell rows respectively indicated by the first dummy word line number and the second dummy word line number are adjacent. The first physical word line identifier includes a first physical word line number, and the second physical word line identifier includes a second physical word line number, and the difference between the first physical word line number and the second physical word line number is greater than one, that is, memory cell rows other than the two memory cell rows are distributed between two memory cell rows respectively indicated by the first physical word line number and the second physical word line number.

In some scenarios, the difference between two physical word line numbers after every two adjacent dummy word line numbers being mapped may be set as a fixed value. In this scenario, when the first dummy word line number is less than the second dummy word line number, the second physical word line number may be the sum of the first physical word line number and a reference value, and the reference value is a positive integer.

For example, if the reference value is 5, the difference between two physical word line numbers after every two adjacent dummy word line numbers being mapped is five.

Table 1 is a schematic diagram of a mapping relation provided by an example of the present application. As shown in Table 1, the physical word line identifiers corresponding to the dummy word line identifiers WL1-WL5 are WL1, WL6, WL11, WL16, and WL21, respectively. The physical word line identifiers corresponding to the dummy word line identifiers WL6-WL10 are WL26, WL31, WL36, WL41, and WL46, respectively. The physical word line identifiers corresponding to the dummy word line identifiers WL11-WL15 are WL51, WL56, WL61, WL66, and WL71, respectively.

Wherein, the 5 pieces of data corresponding to the dummy word line identifier WL1-WL5 correspond to the same parity data, the 5 pieces of data corresponding to the dummy word line identifier WL6-WL10 correspond to the same parity data, and the 5 pieces of data corresponding to the dummy word line identifier WL11-WL16 correspond to the same parity data, the explanation of other parity data in Table 1 will not be described one by one.

As shown in Table 1, for the 5 pieces of data corresponding to the same parity data, when the controller is to write the 5 pieces of data, although the 5 initial word line numbers carried in the write instruction sent by the controller are 5 continuous initial word line numbers, after the peripheral circuit maps the 5 initial word line numbers according to Table 1, difference between two physical word line numbers corresponding to every two adjacent initial word line numbers in the five initial word line numbers is five, thereby, it may implemented that the 5 pieces of data are sequentially written to 5 memory cell rows, and other 5 memory cell rows are also distributed between every two adjacent memory cell rows in the 5 memory cell rows.

The above is an example to illustrate the expression form of the mapping relation. It should be noted that the mapping relation provided by examples of the present application is not limited to the several forms of expression described above, and the mapping relation provided by examples of the present application includes any mapping relation that is able to map adjacent dummy word line numbers to two discontinuous physical word line numbers, which will not be described with examples one by one.

Additionally, the above is described by taking the word line identifier being the word line number as an example. In some examples, when the word line identifier includes another symbol configured to identify the word line, the mapping relation may also be designed with reference to the approach described above.

Operation 703: the peripheral circuit performs the operation corresponding to the operation instruction on the plurality of first-type memory cell rows through the plurality of first-type word lines indicated by the plurality of physical word line identifiers. Wherein, at least one of third-type memory cell rows is distributed between the first memory cell rows and the second memory cell rows in the plurality of first-type memory cell rows, and data stored in the plurality of first-type memory cell rows corresponds to the same parity data.

TABLE 1

| dummy word line number | physical word line number | data | | | | | RAID protection data |
|---|---|---|---|---|---|---|---|
| 1-5 | 1/6/11/16/21 | data | data | data | data | data | parity data |
| 6-10 | 26/31/36/41/46 | data | data | data | data | data | parity data |
| 11-15 | 51/56/61/66/71 | data | data | data | data | data | parity data |
| . . . | . . . | data | data | data | data | data | parity data |
| . . . | 2/7/12/17/22 | data | data | data | data | data | parity data |
| . . . | . . . | data | data | data | data | data | parity data |
| . . . | 3/8/13/18/23 | data | data | data | data | data | parity data |
| . . . | . . . | data | data | data | | data | parity data |

Wherein, the mapping relation shown in Table 1 may be pre-written to the peripheral circuit by a technician. In some examples, the mapping relation may be written to a register of a peripheral circuit. When the control logic unit in the peripheral circuit is to map the initial identifier to the physical word line identifier, the mapping relation may be obtained from the register.

In other scenarios, the difference between two physical word line numbers after every adjacent dummy word line number being mapped may not be set as a fixed value, e.g., the difference may be set as a difference that changes according to a certain rule. For example, the physical word line identifiers corresponding to the dummy word line identifiers WL1-WL5 are WL1, WL3, WL6, WL10, and WL15, respectively. Wherein, the difference between two physical word line numbers after every adjacent dummy word line number being mapped increases sequentially according to the law of 2, 3, 4, and 5.

In other scenarios, each of dummy word line numbers may also be processed according to certain mathematical rules, and the obtained number is the corresponding physical word line number. By this way, it may also be implemented that two physical word line numbers after the adjacent dummy word line numbers being mapped are not adjacent. For example, the physical word line identifiers corresponding to the dummy word line identifiers WL1-WL5 are WL2, WL6, WL12, WL20, and WL30, respectively. Wherein, the physical word line number after each of dummy word line numbers being mapped is obtained by multiplying the dummy word line number by 2.

Wherein, first-type memory cell rows may be understood as the memory cell rows coupled to a first-type word line, therefore, the first-type memory cell rows may also be referred to as a selected memory cell row. A third-type memory cell row may be understood as another memory cell row other than a memory cell row coupled to a first-type word line, therefore, a third-type memory cell row may also be referred to as a non-selected memory cell row.

In some examples, in order to maximize the protection capability of parity data, at least one of third-type memory cell rows is distributed between every two adjacent memory cell rows of the plurality of first-type memory cell rows.

That is, for several data corresponding to a same parity data, no adjacent memory cell rows are not in the memory cell rows in which several data are stored. So as to avoid that the correct data may not be recovered when each of data in adjacent memory cell rows causes an error.

In some examples, the quantity of third-type memory cell rows distributed between every two adjacent memory cell rows of the plurality of first-type memory cell rows is a reference quantity.

For example, when the difference between two physical word line identifiers corresponding to two adjacent dummy word line identifiers in the mapping relation in operation 702 is a parameter value, the quantity of third-type memory cell rows distributed between every two adjacent memory cell rows of the plurality of first-type memory cell rows is a reference quantity. Wherein, the reference value is the same as the reference quantity, e.g., both of which are 5 by referring to table 1.

In some examples, in a portion, at least one of third-type memory cell rows may also be distributed between two adjacent memory cell rows of the plurality of first-type memory cell rows, and in another portion, two adjacent memory cell rows are physically adjacent. Compared with the solution that the plurality of first-type memory cell rows are contiguous memory cell rows in the memory array, this solution may also improve the protection capability of the parity data.

Wherein, when the physical word line identifier corresponding to the initial word line is obtained through the mapping relation in operation 702, the situation of the third-type memory cell rows being distributed between every two adjacent memory cell rows of the plurality of first-type memory cell rows are related to the physical word line identifiers corresponding to the dummy word line identifiers in the mapping relation.

As shown in Table 1, assuming that a plurality of initial word line identifiers are WL1-WL5, the corresponding physical word line identifiers after mapping are WL1, WL6, WL11, WL16, and WL21, respectively. In this scenario, the plurality of first-type memory cell rows are five memory cell rows coupled with WL1, WL6, WL11, WL16, and WL21 respectively. Wherein, there are 5 third-type memory cell rows distributed between every two adjacent memory cell rows.

For other examples of the third-type memory cell rows distributed between every two adjacent memory cell rows of the plurality of first-type memory cell rows, will not be described with examples one by one here, since reference may be made to the content described above.

Additionally, it may be known based on operation 701 that the operation instruction may include a write instruction or a read instruction. Operation 703 is explained and described below in two scenarios.

Scenario 1, the operation instruction includes a write instruction.

In the Scenario 1, the implementation of performing the operation corresponding to the operation instruction on the plurality of first-type memory cell rows through the plurality of first-type word lines indicated by the plurality of physical word line identifiers may be: taking the data to be written corresponding to each of initial word line identifiers as the data to be written corresponding to a respective physical word line identifier, and perform a program operation on the plurality of first-type memory cell rows through the plurality of first-type word lines to store multiple pieces of data to be written to the plurality of first-type memory cell rows.

Since at least one of third-type memory cell rows is distributed between the first memory cell rows and the second memory cell rows in the plurality of first-type memory cell rows, and data stored in the plurality of first-type memory cell rows corresponds to same parity data, thus through the method provided by the example of the present application, it may be implemented that multiple pieces of data corresponds to the same parity data may be written to discontinuous memory cell rows. By this way, it may be implemented that the data stored in adjacent memory cell rows in the memory array corresponds to different parity data. By this way, even if the distance between adjacent memory cell rows is too small and thus the charges will interact with each other, which further causes the data stored in adjacent memory cell rows to be in error at the same time, however since the data stored in adjacent memory cell rows corresponds to different parity data, the data stored in adjacent memory cell rows may be respectively corrected through at least two pieces of parity data, thereby the data protection capability is improved.

FIG. 9 is a flowchart of writing data provided by an example of the present application. As shown in FIG. 9, the data writing process includes the following operations.

The controller obtains the data to be written to the memory array.

The controller divides the data to be written to multiple pieces of data, and each piece of data corresponds to a part of continuous WL numbers, e.g., WL1-5 corresponds to a piece of data to be written, and WL6-10 corresponds to a piece of data to be written.

The controller generates a plurality of parity data according to multiple pieces of data.

In some examples, the parity data may be generated by way of parity check. In some examples, for any piece of data, the total number of bits is determined, each of which is 1 in the data in the binary code, and then parity data is generated for recording the parity of the total number. This may facilitate subsequent verify of the read data according to the parity data.

The above content is as an example to illustrate a method of generating the parity data. In some examples, the parity data may also be generated in other ways, which will not be described with examples one by one here.

The controller sends a write instruction to the memory, and the write instruction carries multiple pieces of data and continuous WL numbers corresponding to each piece of data.

The memory receives the write instruction, and performs the following operations on each piece of data and the corresponding continuous WL number:

taking each WL number of the continuous WL numbers as a dummy-WL number, and mapping according to the mapping relation to obtain the physical WL number corresponding to each dummy-WL number, obtaining several discontinuous physical WL numbers, and then writing the piece of data in sequence to several discontinuous memory cell rows indicated by discontinuous physical WL numbers.

Additionally, in the process of writing data, since several data corresponding to a same parity data are written to discontinuous memory cell rows, when writing data to the memory array, program disturb generated to the adjacent memory cell rows may be reduced when data is being written.

Scenario 2, the operation instruction includes a read instruction.

In Scenario 2, the implementation of performing the operation corresponding to the operation instruction on the plurality of first-type memory cell rows through the plurality of first-type word lines indicated by the plurality of physical word line identifiers may be: performing a read operation on the plurality of first-type memory cell rows through the plurality of first-type word lines to obtain data respectively stored in the plurality of first-type memory cell rows.

Additionally, after the peripheral circuit obtaining the data respectively stored in a plurality of first-type memory cell rows, the peripheral circuit may further send to the controller a result of reading data which carries the data respectively stored in the plurality of first-type memory cell rows, so that the controller receives the result of reading data. The controller determines the data which is read at this time based on the result of reading data.

Additionally, after the peripheral circuit obtaining the data respectively stored in a plurality of first-type memory cell rows, if the data stored in a third memory cell row of the plurality of first-type memory cell rows include erroneous data, the peripheral circuit determines the initial word line identifier corresponding to the physical word line identifier of the third memory cell row; obtains the parity data based on the determined initial word line identifier; and corrects data stored in the third memory cell row based on the parity data.

Wherein, after the peripheral circuit obtaining the data respectively stored in a plurality of first-type memory cell rows, the peripheral circuit may verify whether multiple pieces of data includes erroneous data. Examples of the present application do not limit the approach through which the peripheral circuit verifies whether the read data includes erroneous data. For example, the peripheral circuit may send the read data to the controller, and the host connected to the controller may determine whether the read data includes erroneous data.

In some examples, when a controller writes data to a memory array, the controller also generates a correspondence between the initial word line identifier and the parity data. The correspondence may be stored in a memory array or in other memory devices. When the correspondence is stored in the memory array, the peripheral circuit may obtain the identifier of the parity data corresponding to the initial word line identifier which corresponds to the physical word line identifier of the third memory cell row based on the correspondence, and then obtain the parity data based on the identifier of the parity data. When the correspondence is stored in other memory device, the peripheral circuit may send the initial word line identifier corresponding to the physical word line identifier of the third memory cell row to other memory device, the other memory device may obtain the identifier of the parity data corresponding to the initial word line identifier which corresponds to the physical word line identifier of the third memory cell row based on the correspondence, and the parity data may be obtained by the peripheral circuit based on the identifier of the parity data.

Wherein, there may be a plurality of implementations for the peripheral circuit to obtain the parity data based on the identifier of the parity data. For example, when the parity data is stored in the memory array, the peripheral circuit may directly read the parity data based on the identifier of the parity data. As another example, when the parity data is stored in other memory device, the peripheral circuit may directly read the parity data from the other memory device through the controller based on the identifier of the parity data.

Additionally, the peripheral circuit determines the initial word line identifier corresponding to the physical word line identifier of the third memory cell row, and reference may be made to the implementation of mapping the initial word line identifier to the physical word line identifier in operation 702. For example, the initial word line identifier corresponding to the physical word line identifier of the third memory cell row may be determined through the mapping relation shown in Table 1, and no detailed description is given here.

Additionally, in some examples, after the peripheral circuit obtains multiple pieces of data respectively stored in the first-type memory cell rows, it may also directly send multiple pieces of data to the controller, the controller determines whether the memory data includes erroneous data in, and corrects the erroneous data based on the pre-stored mapping relation between the initial word line identifier and the parity data. In this scenario, since the controller stores the mapping relation between the initial word line identifier and the parity data, the controller may not perform a word line mapping, and may correct the erroneous data directly based on the pre-stored mapping relation between the initial word line identifier and the parity data.

FIG. 10 is a flowchart of reading data provided by an example of the present application. As shown in FIG. 10, the data reading process includes the following operations.

The controller sends a read instruction to the memory, and the read instruction carries a plurality of continuous WL numbers corresponding to the data to be read, e.g., WL1-5, WL6-10, etc.

The memory receives the read instruction, and performs the following operations on each part of the continuous WL numbers:

Each WL number of the part of continuous WL numbers is taken as a dummy WL number, and is mapped according to the mapping relation, to obtain the physical WL number corresponding to each dummy WL number, then the corresponding data is read from the memory cell rows indicated by the physical WL corresponding to each dummy WL number, and the data corresponding to this part of the continuous WL numbers is obtained, and result of reading data is sent to the controller.

The controller verifies and corrects the result of reading data according to the parity data corresponding to each part of continuous WL numbers.

The technical effects of the solutions provided by examples of the present application are further explained and described below in combination with Table 1 and Table 2.

TABLE 2

| word line number | data | | | | | RAID protection data |
|---|---|---|---|---|---|---|
| 1-5 | data | data | data | data | data | parity data |
| 6-10 | data | data | data | data | data | parity data |
| 11-15 | data | data | data | data | data | parity data |
| . . . | data | data | data | data | data | parity data |
| . . . | data | data | data | data | data | parity data |
| . . . | data | data | data | data | data | parity data |
| . . . | data | data | data | data | data | parity data |
| . . . | data | data | data | | data | parity data |

In Table 2, when the peripheral circuit receives t e write instruction, the peripheral circuit directly writes data according to the word line indicated by the initial word line identifier. For example, the 5 initial word line numbers carried by the write instruction are respectively WL1-5 and 5 pieces of data, and these 5 pieces of data correspond to the same parity data. When the peripheral circuit receives the write instruction, the peripheral circuit directly stores the 5 pieces of data to the 5 memory cell rows respectively coupled to WL1-5. By this way, the 5 pieces of data corresponding to the same parity data are written to five a plurality of continuous memory cell rows. Subsequently, if the data stored in two adjacent memory cell rows of the five continuous memory cell rows both have errors, the data stored in two adjacent memory cell rows may not be recovered according to the parity data.

However, as shown in Table 1, for the 5 pieces of data corresponds to the same parity data, although the 5 initial word line numbers carried in the write instruction sent by the controller are 5 continuous initial word line numbers, after the peripheral circuit mapping the 5 initial word line numbers according to Table 1, difference between two physical word line numbers corresponding to every two adjacent initial word line numbers of the five initial word line numbers is five.

For example, the 5 initial word line numbers carried by the write instruction are respectively WL1-5 and 5 pieces of data, and these 5 pieces of data correspond to the same parity data. When the peripheral circuit receives the write instruction, the peripheral circuit determines the physical word line numbers after the initial word line numbers WL1-5 being mapped are WL1, WL6, WL11, WL16, and WL21 according to Table 1, and stores the five pieces of data respectively in the five memory cell rows coupled to WL1, WL6, WL11, WL16, and WL21 respectively. By this way, the 5 pieces of data corresponding to the same parity data are written to five spaced memory cell rows, and 5 third-type memory cell rows are distributed between every two adjacent third-type memory cell rows. Subsequently, if the data stored in two adjacent memory cell rows in the a plurality of continuous memory cell rows both have errors, e.g., the data stored in two adjacent memory cell rows coupled to WL1 and WL2 both have errors, since the data stored in two adjacent memory cell rows coupled to WL1 and WL2 respectively correspond to different parity data, corrections may be performed according to corresponding parity data, respectively.

Additionally, in an example of the present application, the controller may also control whether the peripheral circuit performs the operation instruction according to operation 702 and operation 703. Based on this, in some examples, in operation 702, the implementation of mapping the plurality of initial word line identifiers to the plurality of physical word line identifiers may be: in response to determining that a word line mapping instruction from the controller is received, the peripheral circuit may perform an operation of mapping the plurality of initial word line identifiers to the plurality of physical word line identifiers.

FIG. 11 is a schematic flowchart of another memory operation instruction provided by an example of the present application. As shown in FIG. 11, when the peripheral circuit receives an operation instruction from the controller, the peripheral circuit firstly determines whether a word line mapping instruction from the controller is received at the current time, and if the result of determining is Yes, then operation 702 and operation 703 are performed, that is, the peripheral circuit maps a plurality of initial word line identifiers to a plurality of physical word line identifiers; and performs operation corresponding to the operation instruction on the plurality of first-type memory cell rows through the plurality of first-type word lines indicated by the plurality of physical word line identifiers. Wherein, at least one of third-type memory cell rows is distributed between the first memory cell rows and the second memory cell rows in the plurality of first-type memory cell rows, and data stored in the plurality of first-type memory cell rows corresponds to the same parity data.

Accordingly, if the peripheral circuit dose not receive word line mapping instruction from the controller, the peripheral circuit performs the operation corresponding to the operation instruction on the plurality of second-type memory cell rows through the plurality of second-type word lines indicated by the plurality of initial word line identifiers; wherein, the plurality of second-type memory cell rows include a plurality of continuous memory cell rows in the memory array, and data stored in the plurality of second-type memory cell rows corresponds to the same parity data.

FIG. 12 is a schematic flowchart of another memory operation instruction provided by an example of the present application. As shown in FIG. 12, when the peripheral circuit receives an operation instruction from the controller, the peripheral circuit firstly determines whether a word line mapping instruction from the controller is received at the current time, and if the result of determining is No, then operation 702 and operation 703 are not performed, but the operation corresponding to the operation instruction is performed on the plurality of second-type memory cell rows through the plurality of second-type word lines indicated by the plurality of initial word line identifiers.

Based on this, in the scenario where it is required whether the peripheral circuit performs the operation instruction according to operation 702 and operation 703, e.g., in scenarios where the data to be written is of high importance, the controller may send a word line mapping instruction to the peripheral circuit, to cause the peripheral circuit to perform operation 702 and operation 703 in response to the word line mapping instruction, so as to improve the protection capability of the parity data for the data to be written.

In some examples, in the scenario where the peripheral circuit may not perform the operation instruction according to operation 702 and operation 703, e.g., in scenarios where the data to be written is of general importance, the controller may not send a word line mapping instruction to the peripheral circuit, so that the peripheral circuit directly performs operations on the memory cell rows indicated by the initial word line identifier.

Wherein, the word line mapping instruction may include a predix CMD (a kind of command).

In sum, in an example of this application, since at least one of third-type memory cell rows is distributed between the first memory cell rows and the second memory cell rows in the plurality of first-type memory cell rows, and data stored in the plurality of first-type memory cell rows corresponds to same parity data, thus through the method provided by the example of the present application, multiple pieces of data corresponds to the same parity data may be written to discontinuous memory cell rows. By this way, it may be implemented that the data stored in adjacent memory cell rows in the memory array corresponds to different parity data. By this way, even if the distance between adjacent memory cell rows is too small and thus the charges will interact with each other, which further causes the data stored in adjacent memory cell rows to be wrong at the same time, however since the data stored in adjacent memory cell rows corresponds to different parity data, the data stored in adjacent memory cell rows may be respectively corrected through at least two pieces of parity data, thereby the data protection capability is improved.

Based on the example shown in FIG. 7, an example of the present application also provides a memory, the memory includes: a memory array including a plurality of memory cell rows; a plurality of word lines respectively coupled to the plurality of memory cell rows; and peripheral circuit coupled to the plurality of word lines and configured to implement the method of operating a memory provided by an example of the present application.

In some examples, the peripheral circuit is configured to: receive an operation instruction from the controller, the operation instruction comprises a plurality of initial word line identifiers; map the plurality of initial word line identifiers to a plurality of physical word line identifiers; perform the operation corresponding to the operation instruction on the plurality of first-type memory cell rows through the plurality of first-type word lines indicated by the plurality of physical word line identifiers; wherein, at least one of third-type memory cell rows is distributed between the first memory cell rows and the second memory cell rows in the plurality of first-type memory cell rows, and data stored in the plurality of first-type memory cell rows corresponds to the same parity data.

In some examples, the peripheral circuit is configured to: identify each of the plurality of initial word line identifiers as a dummy word line identifier, and obtain a physical word line identifier corresponding to each of initial word line identifiers from the stored mapping relation between the dummy word line identifier and the physical word line identifier.

In some examples, the mapping relation includes a mapping relation between the first dummy word line identifier and the first physical word line identifier, and a mapping relation between a second dummy word line identifier and a second physical word line identifier; and two memory cell rows coupled to two word lines indicated by the first dummy word line identifier and the second dummy word line identifier are adjacent, and memory cell rows other than the two memory cell rows are distributed between two memory cell rows coupled to two word lines indicated by the first physical word line identifier and the second physical word line identifier.

In some examples, the first dummy word line identifier includes a first dummy word line number, the second dummy word line identifier includes a second dummy word line number, and the difference between the first dummy word line number and the second dummy word line number is one; and the first physical word line identifier includes a first physical word line number, and the second physical word line identifier includes a second physical word line number, and the difference between the first physical word line number and the second physical word line number is greater than one.

In some examples, the first dummy word line number is less than the second dummy word line number; and the second physical word line number is the sum of the first physical word line number and a reference value, and the reference value is a positive integer.

In some examples, at least one of third-type memory cell rows is distributed between every two adjacent memory cell rows of the plurality of first-type memory cell rows.

In some examples, the quantity of third-type memory cell rows distributed between every two adjacent memory cell rows of the plurality of first-type memory cell rows is a reference quantity.

In some examples, the peripheral circuit is configured to: in response to determining that a word line mapping instruction from the controller is received, perform an operation of mapping the plurality of initial word line identifiers to the plurality of physical word line identifiers.

In some examples, the peripheral circuit is also configured to: in response to determining that the word line mapping instruction is not received from the controller, perform the operation corresponding to the operation instruction on the plurality of second-type memory cell rows through the plurality of second-type word lines indicated by the plurality of initial word line identifiers; wherein, the plurality of second-type memory cell rows include a plurality of continuous memory cell rows in the memory array, and data stored in the plurality of second-type memory cell rows corresponds to the same parity data.

In some examples, the operation instruction includes a write instruction, and the write instruction also carries multiple pieces of data to be written corresponding one-to-one to the plurality of initial word line identifiers. The peripheral circuit is configured to: identify the data to be written corresponding to each of initial word line identifiers as the data to be written corresponding to a respective physical word line identifier, and perform a program operation on the plurality of first-type memory cell rows through the plurality of first-type word lines to store multiple pieces of data to be written to the plurality of first-type memory cell rows.

In some examples, the operation instruction includes a read instruction. The peripheral circuit is configured to: perform a read operation on the plurality of first-type memory cell rows through the plurality of first-type word lines to obtain data respectively stored in the plurality of first-type memory cell rows.

In some examples, the peripheral circuit is also configured to: if the data stored in a third memory cell row of the plurality of first-type memory cell rows is erroneous data, determine the initial word line identifier corresponding to the physical word line identifier of the third memory cell row; obtain the parity data based on the determined initial word line identifier; correct data stored in the third memory cell row based on the parity data.

For an implementation of the functions of the peripheral circuits described above, reference may be made to the example shown in FIG. 7, which will not be repeated here.

Additionally, an example of the present application also provides a storage system that includes a memory, and a controller coupled to the memory and configured to control the memory.

The controller is configured to: send the operation instruction to the memory, the operation instruction comprises a plurality of initial word line identifiers. The memory is configured to: receive an operation instruction, and map a plurality of initial word line identifiers to a plurality of physical word line identifiers; perform an operation corresponding to the operation instruction on the plurality of first-type memory cell rows through the plurality of first-type word lines indicated by the plurality of physical word line identifiers.

Wherein, at least one of third-type memory cell rows is distributed between the first memory cell rows and the second memory cell rows in the plurality of first-type memory cell rows, and data stored in the plurality of first-type memory cell rows corresponds to the same parity data.

In some examples, the controller is further configured to: send a word line mapping instruction to the memory; and the memory is further configured to: in response to the word line mapping instruction, perform an operation of mapping the plurality of initial word line identifiers to the plurality of physical word line identifiers.

In some examples, the controller is further configured to: not send a word line mapping instruction to the memory; and the controller is further configured to: perform the operation corresponding to the operation instruction on the plurality of second-type memory cell rows through the plurality of second-type word lines indicated by the plurality of initial word line identifiers. Wherein, the plurality of second-type memory cell rows include a plurality of continuous memory cell rows in the memory array, and data stored in the plurality of second-type memory cell rows corresponds to the same parity data.

In some examples, the operation instruction includes a write instruction, and the write instruction also carries multiple pieces of data to be written corresponding one-to-one to the plurality of initial word line identifiers. The controller is configured to: identify the data to be written corresponding to each of initial word line identifiers as the data to be written corresponding to a respective physical word line identifier, and perform a program operation on the plurality of first-type memory cell rows through the plurality of first-type word lines to store multiple pieces of data to be written to the plurality of first-type memory cell rows.

In some examples, the operation instruction includes a read instruction. The controller is configured to: perform a read operation on the plurality of first-type memory cell rows through the plurality of first-type word lines to obtain data respectively stored in the plurality of first-type memory cell rows; the memory is further configured to: send a result of reading data to the controller, wherein the result of reading data carries the data respectively stored in the plurality of first-type memory cell rows; and the controller is configured to: receive the result of reading data.

For implementations of the functions of the controller and memory described above, reference may be made to the example shown in FIG. 7, which will not be repeated here.

FIG. 13 is a structure schematic diagram of a controller provided by an example of the present application. As shown in FIG. 13, the controller 1300 includes a processing unit 1301, and the processing unit 1301 may be, e.g., an MCU (microcontroller unit), etc.

Wherein, the controller 1300 is configured to implement the functions of the controllers in the foregoing examples, so as to implement the storage system provided in examples of the present application. For an implementation, reference may be made to the example shown in FIG. 7, which will not be described in detail here.

Additionally, an example of the present application also provides a peripheral circuit, the control logic unit in the peripheral circuit includes at least one software module, and the at least one software module is configured to implement any of the Operations in the method of operating a memory in the example shown in FIG. 7.

Additionally, an example of the present application also provides a computer storage medium, which stores instructions, that when executed by the peripheral circuit in the memory, implements any of the Operations in the method of operating a memory in the example shown in FIG. 7.

In another aspect, a computer program product including instructions is provided, and when the instructions are run in the peripheral circuit, the instructions implement any of the Operations in the method of operating a memory in the example shown in FIG. 7.

Those of ordinary skill in the art may understand that all or part of the Operations for implementing the examples described above may be completed by hardware, and may also be completed by instructing related hardware through a program, and the program may be stored in a computer-readable storage medium, and the storage medium mentioned above may be a read-only memory, a magnetic disk or an optical disk, etc.

The above description is only examples of the application, and is not intended to limit the application, and any modification, equivalent replacement and improvement, etc., made within the spirit and principles of this application shall be included within the protection scope of this application.

What is claimed is:

1. A memory, comprising:
    a memory array, including a plurality of memory cell rows;
    a plurality of word lines each coupled to a respective one of the plurality of memory cell rows; and
    a peripheral circuit coupled to the plurality of word lines and is-configured to:

receive an operation instruction from a controller, wherein the operation instruction comprises a plurality of initial word line identifiers;
    map each of the plurality of initial word line identifiers to a respective one of a plurality of physical word line identifiers, the plurality of physical word line identifiers indicating a plurality of first-type word lines that are discontinuous; and
    perform an operation corresponding to the operation instruction on a plurality of first-type memory cell rows through the plurality of first-type word lines indicated by the plurality of physical word line identifiers,
    wherein, at least one of third-type memory cell rows is distributed between first memory cell rows and second memory cell rows in the plurality of first-type memory cell rows, data stored in the plurality of first-type memory cell rows corresponds to first parity data, and data stored in the at least one of third-type memory cell rows corresponds to second parity data different from the first parity data; and
    where in the peripheral circuit is further configured to:
        identify each of the plurality of initial word line identifiers as a dummy word line identifier; and
        obtain a physical word line identifier corresponding to each of the plurality of initial word line identifiers from a stored mapping relation between the dummy word line identifier and the physical word line identifier.

2. The memory of claim 1, wherein the mapping relation includes: a mapping relation between a first dummy word line identifier and a first physical word line identifier, and a mapping relation between a second dummy word line identifier and a second physical word line identifier; and wherein two memory cell rows coupled to two word lines indicated by the first dummy word line identifier and the second dummy word line identifier are adjacent, and memory cell rows other than the two memory cell rows are distributed between two memory cell rows coupled to two word lines indicated by the first physical word line identifier and the second physical word line identifier.

3. The memory of claim 2, wherein the first dummy word line identifier includes a first dummy word line number, the second dummy word line identifier includes a second dummy word line number, and a difference between the first dummy word line number and the second dummy word line number is one; and wherein
    the first physical word line identifier includes a first physical word line number, and the second physical word line identifier includes a second physical word line number, and a difference between the first physical word line number and the second physical word line number is greater than one.

4. The memory of claim 3, wherein the first dummy word line number is less than the second dummy word line number; and wherein
    the second physical word line number is a sum of the first physical word line number and a reference value, and the reference value is a positive integer.

5. The memory of claim 1, wherein at least one of the third-type memory cell rows is distributed between every two adjacent memory cell rows of the plurality of first-type memory cell rows.

6. The memory of claim 5, wherein a quantity of the third-type memory cell rows distributed between every two adjacent memory cell rows of the plurality of first-type memory cell rows is a reference quantity.

7. The memory of claim 1, wherein the peripheral circuit is configured to:

in response to determining that a word line mapping instruction is received from the controller, perform an operation of mapping the plurality of initial word line identifiers to the plurality of physical word line identifiers.

8. The memory of claim 7, wherein the peripheral circuit is further configured to:

in response to determining that the word line mapping instruction is not received from the controller, perform the operation corresponding to the operation instruction on a plurality of second-type memory cell rows through a plurality of second-type word lines indicated by the plurality of initial word line identifiers;

wherein, the plurality of second-type memory cell rows include a plurality of continuous memory cell rows in the memory array, and data stored in the plurality of second-type memory cell rows correspond to same parity data.

9. The memory of claim 1, wherein the operation instruction includes a write instruction that comprises a plurality of pieces of data to be written correspondingly to the plurality of initial word line identifiers;

the peripheral circuit is configured to:

identify data to be written corresponding to each of the initial word line identifiers as data to be written corresponding to a respective physical word line identifier; and perform a program operation on the plurality of first-type memory cell rows through the plurality of first-type word lines, to store the plurality of pieces of data to be written to the plurality of first-type memory cell rows.

10. The memory of claim 1, wherein the operation instruction comprises a read instruction;

the peripheral circuit is configured to:

perform a read operation on the plurality of first-type memory cell rows through the plurality of first-type word lines, to obtain data stored in the plurality of first-type memory cell rows.

11. The memory of claim 10, wherein the peripheral circuit is further configured to:

in response to determining that data stored in a third memory cell row of the plurality of first-type memory cell rows is erroneous data, determine the initial word line identifier corresponding to the physical word line identifier of the third memory cell row;

obtain the first parity data based on the determined initial word line identifier; and correct data stored in the third memory cell row based on the first parity data.

12. A storage system, comprising:

a memory, configured to:

receive an operation instruction, the operation instruction comprises a plurality of initial word line identifiers;

map the plurality of initial word line identifiers to a plurality of physical word line identifiers, the plurality of physical word line identifiers indicating a plurality of first-type word lines that are discontinuous; and perform an operation corresponding to the operation instruction on a plurality of first-type memory cell rows through the plurality of first-type word lines indicated by the plurality of physical word line identifiers; and a controller coupled to the memory and configured to control the memory and send the operation instruction to the memory, wherein, at least one of third-type memory cell rows is distributed between first memory cell rows and send memory cell rows in the plurality of first-type memory cell rows, data stored in the plurality of first-type memory cell rows corresponds to first parity data, and data stored in the at least one of third-type memory cell rows corresponds to second parity data different from the first parity data, wherein the controller coupled to the memory is further configured to:

identify each of the plurality of initial word line identifiers as a dummy word line identifier by sending a word line mapping instruction to the memory; and wherein the memory is further configured to:

obtain a physical word line identifier corresponding to each of the plurality of initial word line identifiers from a stored mapping relation between the dummy word line identifier and the physical word line identifier.

13. The storage system of claim 12, wherein the memory is further configured to: in response to determining that word line mapping instruction is not received, perform the operation corresponding to the operation instruction on a plurality of second-type memory cell rows through a plurality of second-type word lines indicated by the plurality of initial word line identifiers;

wherein, the plurality of second-type memory cell rows include a plurality of continuous memory cell rows in the memory, and data stored in the plurality of second-type memory cell rows corresponds to the same parity data.

14. The storage system of claim 12, wherein the operation instruction includes a write instruction that comprises a plurality of pieces of data to be written corresponding one-to-one to the plurality of initial word line identifiers;

the memory is configured to:

identify data to be written corresponding to each of the initial word line identifiers as data to be written corresponding to a respective physical word line identifier; and perform a program operation on the plurality of first-type memory cell rows through the plurality of first-type word lines, to store the plurality of pieces of data to be written to the plurality of first-type memory cell rows.

15. The storage system of claim 12, wherein the operation instruction comprises a read instruction;

the memory is configured to:

perform a read operation on the plurality of first-type memory cell rows through the plurality of first-type word lines to obtain data stored in the plurality of first-type memory cell rows; and send a result of reading data to the controller, wherein the result of reading data carries the data respectively stored in the plurality of first-type memory cell rows; and the controller is configured to: receive the result of reading data.

16. A method of operating a memory, comprising:

receiving an operation instruction from a controller, wherein the operation instruction comprises a plurality of initial word line identifiers;

mapping the plurality of initial word line identifiers to a plurality of physical word line identifiers, the plurality of physical word line identifiers indicating a plurality of first-type word lines that are discontinuous; and performing an operation corresponding to the operation instruction on a plurality of first-type memory cell words through the plurality of first-type word lines indicated by the plurality of physical word line identifiers, wherein, at least one of third-type memory cell rows is distributed between first memory cell rows and second memory cell rows in the plurality of first-type memory cell rows, data stored in the plurality of first-type memory cell rows corresponds to first parity data, and data stored in the at least one of third-type memory cell rows corresponds to second parity data different from the first parity data;

wherein, mapping the plurality of initial word line identifiers to a plurality of physical word line identifiers includes:

identifying each of the plurality of initial word line identifiers as a dummy word line identifier; and obtaining a physical word line identifier corresponding to each of the plurality of initial word line identifiers from a stored mapping relation between the dummy word line identifier and the physical word line identifier.

17. The method of claim 16, wherein the mapping relation includes: a mapping relation between a first dummy word line identifier and a first physical word line identifier, and a mapping relation between a second dummy word line identifier and a second physical word line identifier; and wherein two memory cell rows coupled to two word lines indicated by the first dummy word line identifier and the second dummy word line identifier are adjacent, and memory cell rows other than the two memory cell rows are distributed between two memory cell rows coupled to two word lines indicated by the first physical word line identifier and the second physical word line identifier.

* * * * *